United States Patent [19]

Ku et al.

[11] Patent Number: 5,010,039

[45] Date of Patent: Apr. 23, 1991

[54] METHOD OF FORMING CONTACTS TO A SEMICONDUCTOR DEVICE

[76] Inventors: San-Mei Ku, 3 Carnelli Ct., Poughkeepsie, N.Y. 12603; Kathleen A. Perry, 22120 Viscanio Rd., Woodland Hills, Calif. 91364

[21] Appl. No.: 351,993

[22] Filed: May 15, 1989

[51] Int. Cl.$^5$ .......................................... H01L 21/47
[52] U.S. Cl. ....................................... 437/228; 437/7; 437/31; 437/186; 437/195; 437/233; 437/235; 437/236; 437/241; 148/DIG. 11; 148/DIG. 124
[58] Field of Search ................. 437/228, 195, 186, 31, 437/7; 148/DIG. 51, DIG. 11, DIG. 124

[56] References Cited

U.S. PATENT DOCUMENTS

| | | | |
|---|---|---|---|
| 4,455,194 | 6/1984 | Yabu et al. | 156/653 |
| 4,465,552 | 8/1984 | Bobbio et al. | 156/643 |
| 4,481,706 | 11/1984 | Roche | 29/577 C |
| 4,536,949 | 8/1985 | Takayama et al. | 437/186 |
| 4,624,739 | 11/1986 | Nixon et al. | 156/643 |
| 4,648,937 | 3/1987 | Ogura et al. | 156/643 |
| 4,668,338 | 5/1987 | Maydan et al. | 156/643 |
| 4,671,970 | 6/1987 | Keiser et al. | 427/93 |
| 4,686,000 | 8/1987 | Heath | 437/40 |
| 4,767,724 | 8/1988 | Kim et al. | 437/194 |
| 4,789,648 | 12/1988 | Chow et al. | 437/228 |
| 4,789,885 | 12/1988 | Brighton et al. | 148/DIG. 147 |
| 4,795,722 | 1/1989 | Welch et al. | 437/195 |
| 4,816,115 | 3/1989 | Hörner et al. | 437/228 |

OTHER PUBLICATIONS

IBM Technical Disclosure Bulletin, vol. 24, No. 10, Mar. 1982, S. Boyar et al., "Quartz Trench Rie Etch Stop", pp. 5133–5134.
IBM Technical Disclosure Bulletin, vol. 23, No. 4, Sep. 1989, "Use OF Oxidized Silicon Nitride as an Etch Stop for Plasma Etching" by B. L. Humphrey, p. 1360.

*Primary Examiner*—Brian E. Hearn
*Assistant Examiner*—Trung Dang
*Attorney, Agent, or Firm*—Jeffrey L. Brandt

[57] ABSTRACT

A method of forming semiconductor device contacts includes the steps of: providing a semiconductor substrate having at least two features thereon whereat it is desired to make electrical connections; forming a layer of etch stop material having a first etch characteristic over each of the features; forming a layer of dielectric material having a second etch characteristic over each of the features; simultaneously etching at least two vias through the layer of dielectric material using an etchant selective to the layer of dielectric material so as to substantially stop on the layer of etch stop material, the at least two vias including a via over each of the features; and extending the vias through the layer of etch stop material so as to expose the features for subsequent electrical connections.

8 Claims, 7 Drawing Sheets

METHOD OF FORMING CONTACTS TO A SEMICONDUCTOR DEVICE

The present invention is directed generally to the fabrication of semiconductor devices and more particularly to a method of making electrical connections to selected device features.

BACKGROUND OF THE INVENTION

In fabricating semiconductor devices it is often necessary to etch through a layer of insulating material to expose underlying topography such as device regions or contacts. It may be necessary, for example, to etch through a layer of silicon dioxide or glass insulator in order to expose silicon or polysilicon device contacts for subsequent connection to metal. Such etching is typically done with an anisotropic etch process, for example a reactive ion etch (RIE) process using an appropriate plasma etchant.

As device topography becomes increasingly complex, requiring openings of differing widths to features of different heights, the above-described etching processes become increasingly difficult to control. That is, etching tends to continue uncontrollably into the shallower, underlying device features while the process is continued to expose the deeper features. In a similar manner, etching of wider openings tends to progress more quickly than that of narrower openings, also continuing undesirably into the underlying features. This results in damage to the inadvertently etched features.

It is known in the art to use etchants and etch processes which are selective, or preferential, to different materials. U.S. Pat. Nos. 4,465,552, and 4,624,739, for example, show the use of etchants selective to materials overlying silicon or polysilicon. U.S. Pat. Nos. 4,481,706, 4,671,970, 4,668,338, 4,648,937, and 4,455,194 show the use of silicon or polysilicon as an etch stop for an etchant selective to overlying materials. U.S. Pat. No. 4,455,194, for example, shows the forming of a fuse simultaneously with a transistor wherein polysilicon is used as an etch-stop for phosphosilicate glass (PSG).

IBM Technical Disclosure Bulletin Vol. 24, No. 10, March 1982, titled: QUARTZ TRENCH RIE ETCH STOP, to S. Boyar et al., describes the use of both magnesium oxide and metal as an etch stop for quartz.

IBM Technical Disclosure Bulletin Vol. 23, No. 4, September 1980, titled: USE OF OXIDIZED SILICON NITRIDE AS AN ETCH STOP FOR PLASMA ETCHING, to Humphrey, shows the use of silicon oxynitride as an etch stop for polysilicon.

None of the above-described publications, however, are believed to provide etching processes which are sufficiently well-controlled for use with the complex topographies of state-of-the-art semiconductor devices.

SUMMARY OF THE INVENTION

An object of the present invention is to provide a new and improved method of etching apertures for making electrical contacts in the formation of semiconductor devices.

Another object of the present invention is to provide such a method of etching apertures of differing widths while inhibiting undesirable over-etching.

A further object of the present invention is to provide such a method of etching apertures to underlying features of varying heights while inhibiting undesirable over-etching.

Yet another object of the present invention is to provide a method of etching of the above-described type which is readily adaptable to conventional semiconductor processing techniques.

In accordance with another aspect of the present invention, there is provided a new and improved method of forming electrical connections to an extrinsic base contact, an emitter contact, and a subcollector reachthrough region of a bipolar transistor, comprising the steps of: forming a layer of etch stop material having a first etch characteristic conformally over the base and emitter contacts and subcollector reachthrough region; forming a layer of dielectric material having a second etch characteristic over the layer of etch stop material; simultaneously etching base contact and subcollector reachthrough vias through the layer of dielectric material using an etchant selective to the dielectric material so as to stop on the layer of etch stop material over the base contact and subcollector reachthrough region; extending the base contact and subcollector reachthrough vias through the layer of etch stop material so as to expose the surfaces of the base contact and the subcollector reachthrough region; forming a mask over the base contact and subcollector reachthrough vias; etching an emitter contact via through the layer of dielectric material using an etchant selective to the dielectric material so as to stop on the layer of etch stop material over the emitter contact; extending the emitter contact via through the layer of etch stop material to the surface of the emitter contact; and removing the mask.

BRIEF DESCRIPTION OF THE DRAWINGS

These and other objects, features, and advantages of the present invention will become apparent through a consideration of the following detailed description of the invention when read in conjunction with the drawing Figures, in which.

DETAILED DESCRIPTION OF THE INVENTION

Figure 1A:
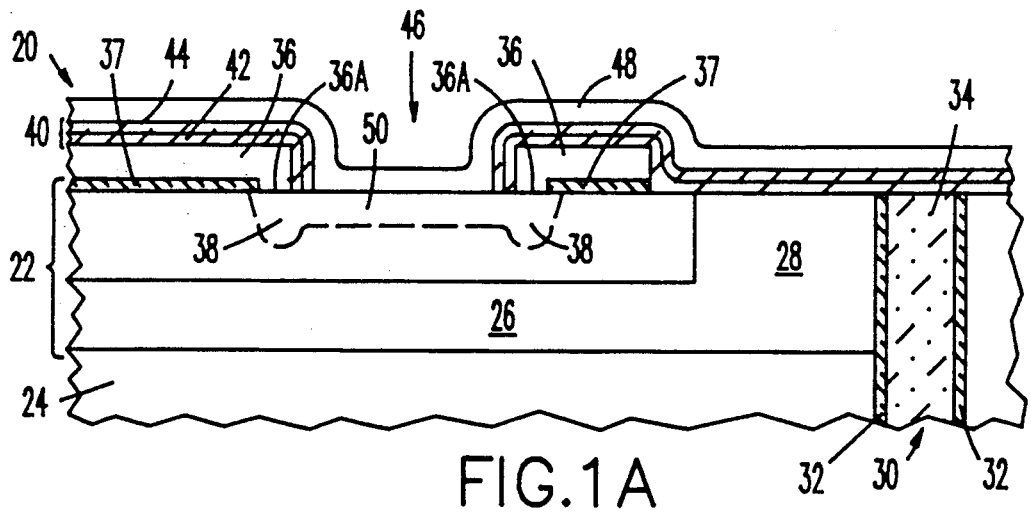
FIGS. 1A-1J are cross-sectional views showing successive steps in fabricating a semiconductor device in accordance with one embodiment of the present invention.

Referring now to the drawings, FIG. 1A shows a device region 20 of a semiconductor chip including an N− epitaxial layer 22 grown on the surface of a P silicon substrate 24. It will be understood that references to N and P type semiconductor materials denote dopant types and, where appropriate, relative "+" and "−" concentrations.

A highly doped N+ subcollector region 26 is buried proximate the bottom of epitaxial layer 22, and a similarly doped reachthrough region 28 extends vertically to connect the subcollector region to the surface of the epitaxial layer.

An isolation trench 30 surrounds device region 20 and extends downward from the surface of epitaxial layer 22 into substrate 24. Isolation trench 30 includes an insulative thermal oxide wall 32 and an insulative fill 34 such as polysilicon, and functions to electrically isolate the transistor to be formed in device region 20 from surrounding devices (not shown).

A ring-shaped (as viewed from the top) region 36 of P+ doped polysilicon is situated on the surface of epitaxial layer 22 over buried subcollector region 26, portions of region 36 being spaced from the epitaxial layer by an insulating layer of silicon dioxide 37. The inner periphery of region 36 contacts epitaxial layer 22 at contact area 36A, and functions as a self-aligned extrinsic base contact to a similarly ring-shaped, P+ extrinsic base region 38. Extrinsic base region 38 is formed, for example, by outdiffusion from the overlying P+ polysilicon extrinsic base contact 36A. A stack 40 of silicon dioxide ($SiO_2$) 42 and silicon nitride ($Si_3N_4$) 44 insulating layers is situated generally conformally over the extrinsic base contact 36 and the surface of the device, excepting for an aperture 46 within the extrinsic base contact wherein the stack has been removed.

A layer 48 of polysilicon is situated generally conformally over the device described above, and an intrinsic P base region 50 is situated in the surface of epitaxial layer 22 generally under aperture 46 and linked up with extrinsic base region 38.

The above-described device structure of FIG. 1A is shown for the purpose of illustrating the present invention, and is a conventional structure in the art, amenable to fabrication by the use of many known semiconductor manufacturing techniques. For further guidance in the construction of such a device, the reader is directed to the teachings of U.S. Pat. No. 4,431,460 to Barson et al., assigned to the assignee of the present invention and incorporated herein by reference. The Barson et al. patent teaches one method of fabricating a substantially identical structure. It will be understood from a consideration of the description below that the present invention is not limited to the above-described device structure.

Figure 1B:
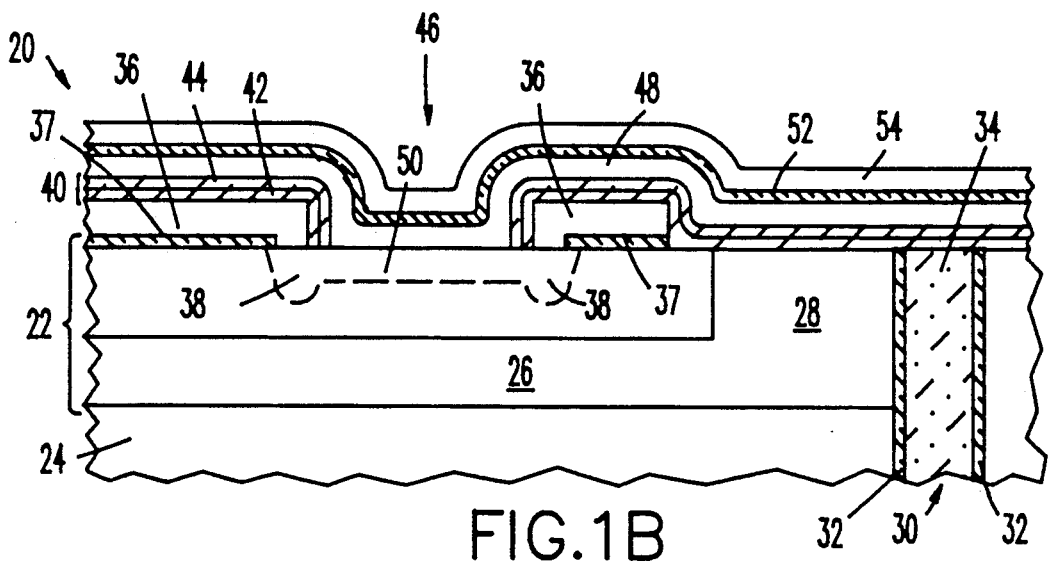

Referring now to FIG. 1B, a layer 52 of $SiO_2$ is formed conformally over the device to a thickness in the range of 100-200 Angstroms. Oxide layer 52 can be formed, for example, by a conventional process such as thermal growth, chemical vapor deposition (CVD), or plasma-enhanced CVD. A layer 54 of intrinsic, undoped polysilicon is formed conformally over oxide layer 52, using a conventional CVD process, to a thickness in the range of 1,000-3,000 Angstroms.

Figure 1C:
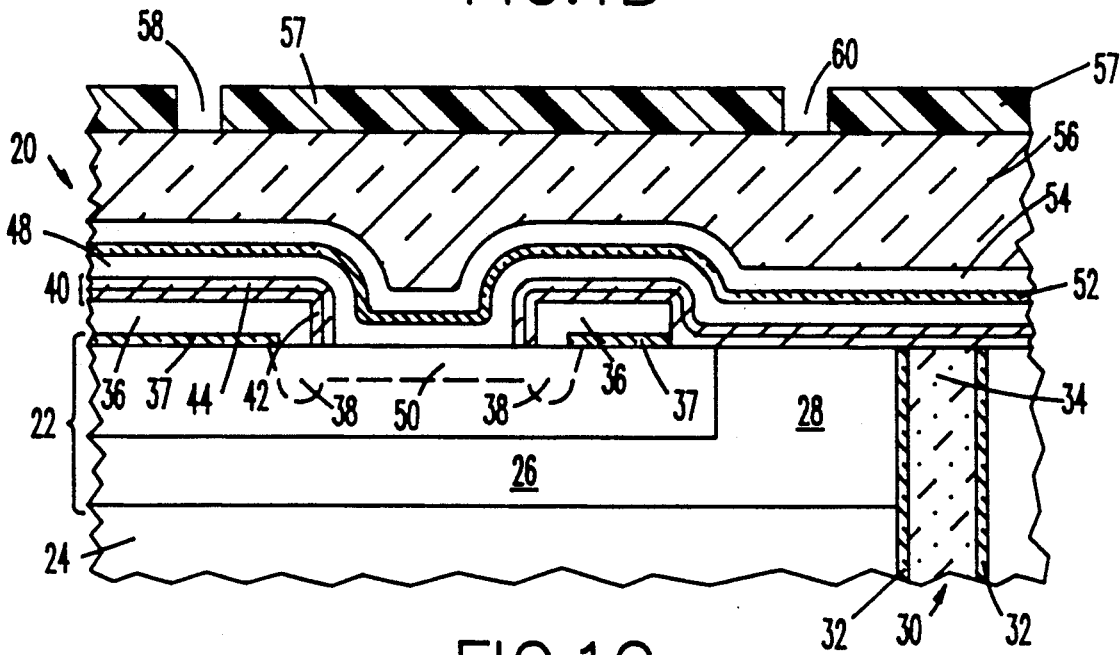

Referring now to FIG. 1C, a layer 56 of quartz (or other low-dielectric material as discussed in further detail below) is sputter-deposited conformally over the surface of the device and planarized to a thickness in the range of about 1.0-1.5 micrometers. This planarization can be accomplished, for example, using a conventional process of chemical-mechanical polishing. A photoresist mask 57 is formed over the planarized surface of layer 56 using conventional photolithographic techniques. Mask 57 includes an aperture 58 overlying the leftmost portion of extrinsic base contact 36, and an aperture 60 overlying the top surface of subcollector reachthrough region 28. In a manner described below, mask apertures 58, 60 will be used to form vias for metal contacts to the underlying device structures.

Figure 1D:
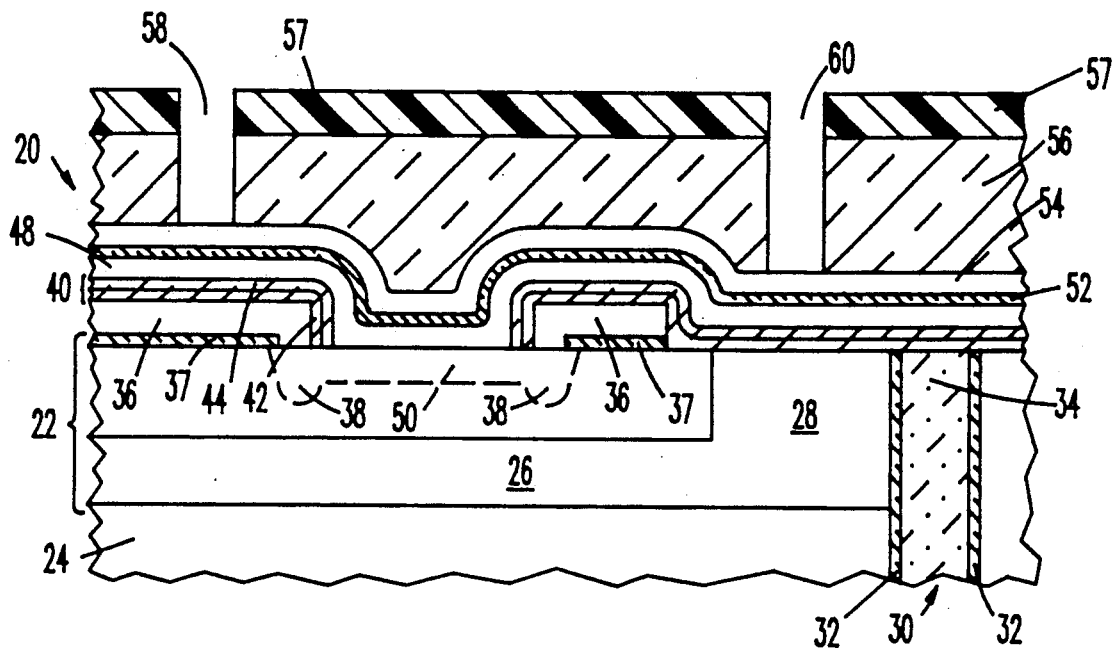

Referring now to FIG. 1D, an anisotropic RIE process using, for example, a $CF_4/CHF_3/Ar$ plasma, is utilized to etch through layer 56, thereby extending apertures 58, 60 downward into contact with intrinsic polysilicon layer 54. It will be noted by the reader that, due to the presence of extrinsic base contact 36 underlying aperture 58, aperture 58 is of a different vertical height than is aperture 60. Aperture 58 is thus formed in significantly less time during the above-described RIE process than is aperture 60. In accordance with a major feature and advantage of the present invention, the use of intrinsic polysilicon layer 54 as an etch stop for the RIE process prevents over-etching in the bottom of via 58, and hence prevents damage to the underlying device structures.

It will be understood that the present invention is not limited to the use of intrinsic polysilicon as an etch stop for quartz. Any two materials exhibiting significantly different etch rates would suffice. The desired etch ratio of the insulator to the etch stop is at least about 25:1. While it is preferable to use an intrinsic insulator such as quartz for layer 56, other insulating materials such as phosphosilicate glass (PSG) and borosilicate glass (BSG) glass, and organics such as polyimide, would suffice. Insulators with low dielectric constants are preferred, as they lower the capacitance between subsequent layers of metallization.

Etch-stop layer 54 is preferably selected to exhibit the characteristics of: (1) the desired high etch ratio, (2) easy removal by appropriate wet or RIE etchants, (3) formability at relatively low temperatures so as not to affect the shallow doping profiles in the underlying device, and (4) an intrinsic lack of doping so as not to alter the dopant concentration of adjoining materials. Etch-stop layer 54 could alternatively comprise, for example, insulators such as $Al_2O_3$ or $MgO_2$.

Figure 1E:
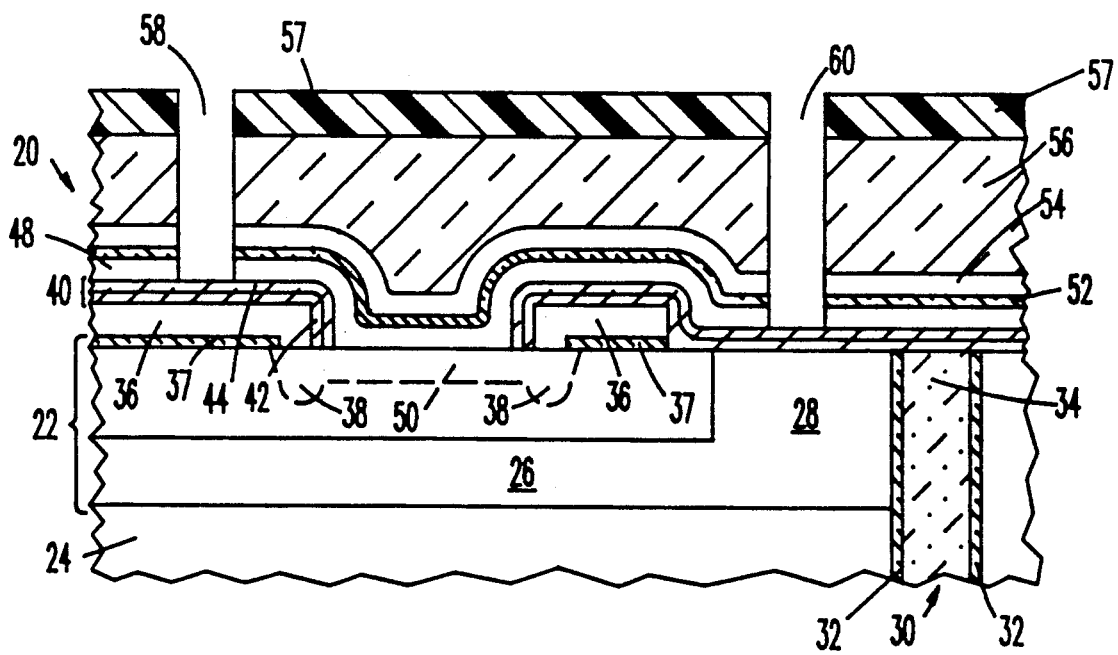

Referring now to FIG. 1E, subsequent to the use of etch-stop layer 54 to open vias 58, 60 to differing depths, a RIE process with $CL_2$, or $Cl_2/O_2/Ar$, or $SF_6/Cl_2$ plasma is used to remove the exposed layer 54 within the apertures. An appropriate wet etch or RIE process, for example an HF wet etch or a RIE with $CF_4$ plasma, is used to remove the exposed layer 52 of oxide. Vias 58, 60 are further extended by using an appropriate RIE process to remove the exposed layer 48 of intrinsic polysilicon. Resist layer 57 is then stripped by a conventional process.

It will be appreciated that, even though vias 58, 60 are of differing depths, the etched regions of layers 54, 52, 48 are of substantially identical thickness within each of the apertures, respectively, and hence etch at the same rate. There is thus no substantial danger of over-etching in the process steps described with respect to FIG. 1E.

Figure 1F:
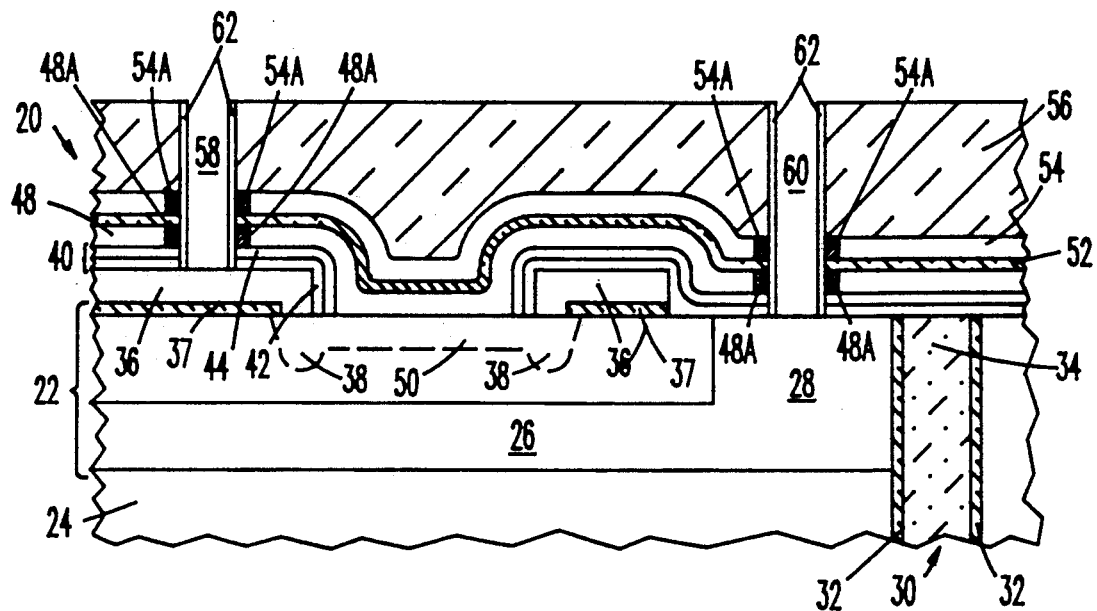

Referring now to FIG. 1F, device 20 is subjected to a conventional thermal oxidation process so as to form 1,000 Angstrom-thick layers of thermal oxide 48A, 54A at the exposed edges of layers 48, 54, respectively, within apertures 58, 60. Optional layers 62 of insulating material can then be formed as vertical liners over the walls of apertures 58, 60. Insulating layer 62 can comprise, for example, $SiO_2$ or $Si_3N_4$ deposited conformally (not shown) over device 20 using a conventional CVD or PECVD process, and then etched anisotropically to leave the vertical layers insulating the walls of vias 58, 60.

Appropriate RIE processes are then used to remove the exposed portions of layers 42, 44 within vias 58, 60. Via 58 is thus extended into contact with the upper surface of extrinsic base contact 36, while via 60 is extended into contact with the upper surface of subcollector reachthrough region 28.

Figure 1G:
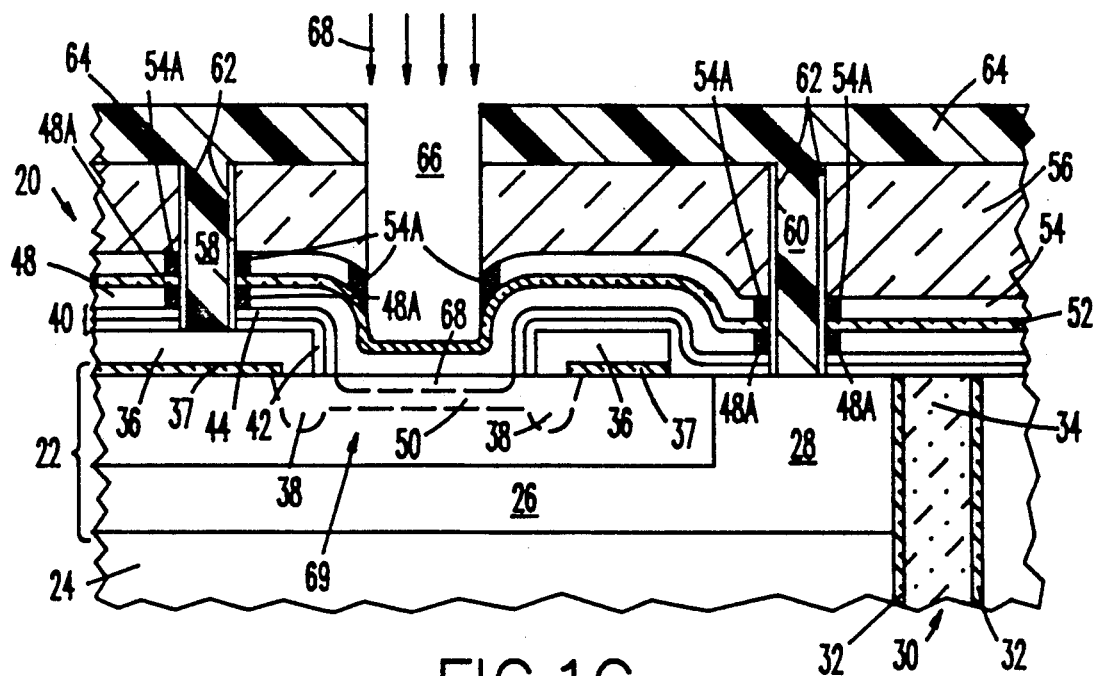

Referring now to FIG. 1G, conventional photolithographic techniques are used to form a resist mask 64 generally conformally over the surface of the device, filling vias 58, 60 and patterned with an aperture 66 centered within extrinsic base contact 36 for defining the position of an emitter. Mask 64 is used with the appropriate etchants described hereinabove to anisotropically etch first through quartz layer 56 to etch-stop layer 54, and then through the etch-stop layer to oxide layer 52.

Device 20 is subjected to a conventional thermal oxidation process to form additional 1,000 Angstrom-thick thermal oxide spacers 54A on the exposed edges of intrinsic polysilicon layer 54 within aperture 66. An ion implant process is then performed, with an N+ dopant 68 such as Arsenic, to dope the portion of polysilicon layer 48 covered by oxide 52 in aperture 66. This ion implant is performed, for example, at an energy in the range of about 30–40 Kev and a dosage in the range of about $1-3 \times 10^{16}$ ions/cm$^2$. This ion implantation begins the formation of an emitter region 68 on the surface of intrinsic base region 50.

It will be noted that, in accordance with further features and advantages of the present invention, the filling of vias 58, 60 (with photoresist layer 64) during the formation of emitter region 68 permits the emitter region to be doped without changing the concentration of the regions a the bottoms of vias 58, 60. The use of etch-stop layer 54 is instrumental in this process of forming emitter via 66 last by facilitating the formation of the via while inhibiting accidental over-etching.

Continuing to describe FIG. 1G, photoresist layer 64 is removed by conventional means. Device 20 is subjected to conventional thermal drive-in and annealing heat cycles so as to complete the formation of emitter region 68 and activate the same. These drive-in and annealing heat cycles can also be used to augment the formation of the thermal oxide layers 54A in aperture 66, or can even be used in lieu of the separate oxidation process described above.

It will be appreciated that, in accordance with the above-described process, a vertical, bipolar NPN transistor 69 has been formed in device region 20, the transistor including: buried subcollector region 26, intrinsic base region 50, and emitter region 68.

Figure 1H:
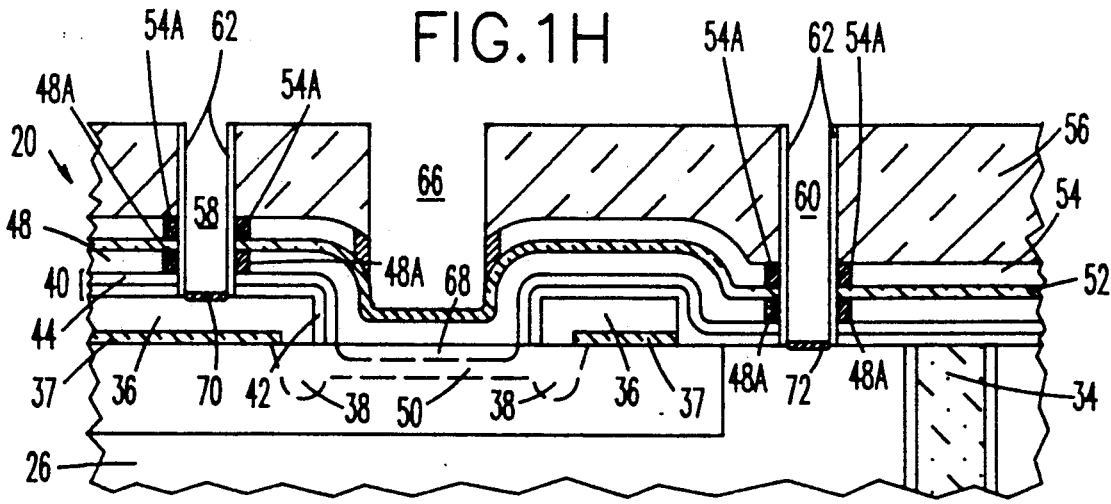

Referring now to FIG. 1H, a layer (not shown) of platinum is formed conformally over the surface of device 20, for example by a process of sputtering or evaporation. Device 20 is then sintered, for example at about 550 degrees centigrade for about 20 minutes, to form layers 70, 72 of PtSi alloy on the exposed surfaces at the bottom of vias 58, 60, respectively. Oxide layer 52 at the bottom of via 66 prevents the formation of PtSi thereat, and the unreacted Pt is stripped off the device by etching in aqua regia.

Figure 1I:
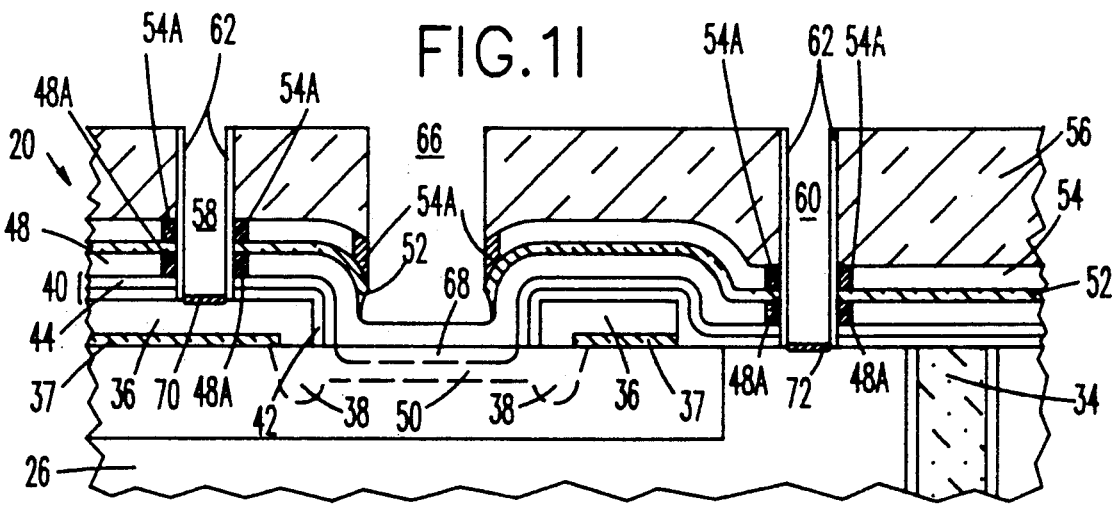

Referring now to FIG. 1I, device 20 is subjected to a dip in a dilute HF solution to remove the portion of oxide layer 52 exposed in aperture 66. Because layer 52 is substantially thinner than the oxide layers 54A within the same aperture 66, layer 52 can be removed entirely without substantially affecting the thicker layers.

Figure 1J:
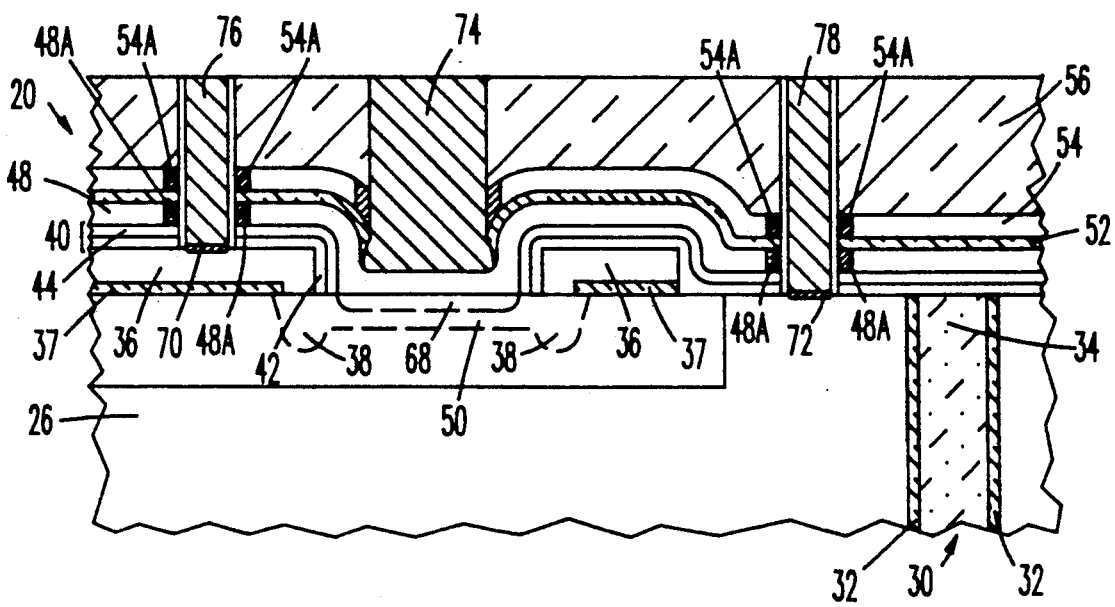

Referring now to FIG. 1J, a metal, for example Tungsten or an aluminum-copper alloy, is deposited by conventional sputtering, evaporation, or CVD processes so as to fill in vias 58, 60, 66 and cover the surface of quartz layer 56. This metal is then planarized to the upper surface of quartz layer 56, for example using a conventional chemical-mechanical polishing process, to form the metal studs 74, 76, 78 in vias 66, 58, 60, respectively. Studs 74, 76, 78 function as electrical contacts to the emitter, extrinsic base, and subcollector reachthrough regions, respectively, of bipolar transistor 69, and are contacted by subsequent layers of metallization (not shown) to connect the transistor as required.

Referring now to the alternate embodiment of the invention shown in FIGS. 2A-2I, FIG. 2A shows a device portion 80 of a semiconductor chip identical in structure to the device shown in FIG. 1B above, with the exception of the addition of a photoresist mask 82, and the preliminary doping of polysilicon layer 48 so as to form emitter region 68.

In this present embodiment of the invention, the ion implanting step used to form emitter region 68 (described above with respect to FIG. 1G) is performed (with appropriate photolithographic masking) after the formation of polysilicon layer 48 and oxide layer 52, and before the formation of polysilicon layer 54. A partial emitter drive-in cycle is also performed so as to begin the formation of emitter region 68.

Photoresist mask 82, formed by conventional photolithographic techniques, is shown patterned so as to leave mask portions 82A, 82B, and 82C. Mask portion 82A is situated over what will become a device contact to the left-most portion of extrinsic base contact 36. In a similar manner, mask regions 82B, 82C are situated over what will become device contacts to the emitter contact, and subcollector reachthrough regions, respectively. Features otherwise identical to those shown in FIG. 1B are indicated by like reference numbers.

Figure 2A:
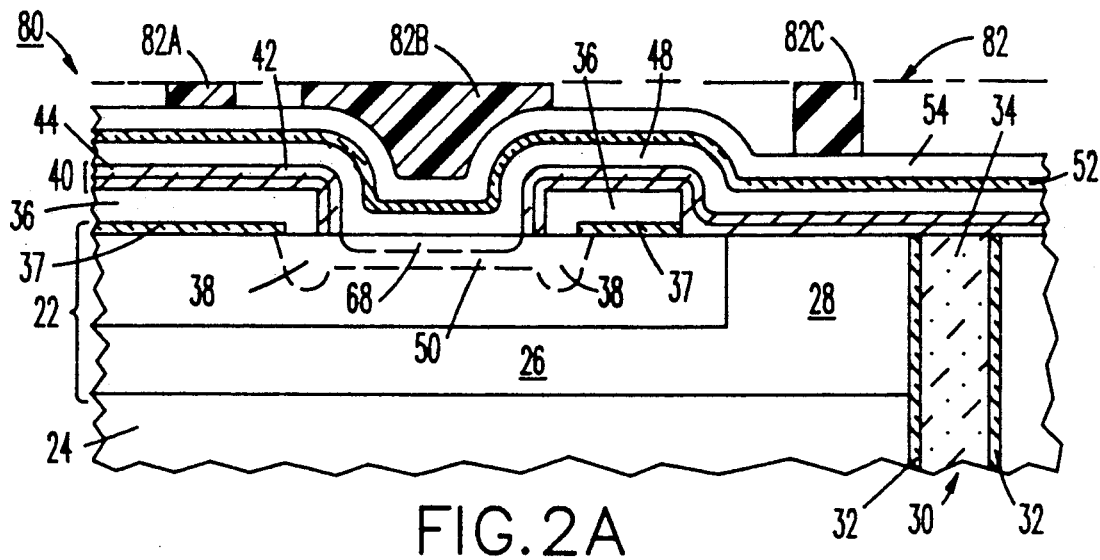
FIGS. 2A-2I are cross-sectional views showing successive steps in fabricating a semiconductor device in accordance with a second embodiment of the present invention.
Figure 2B:
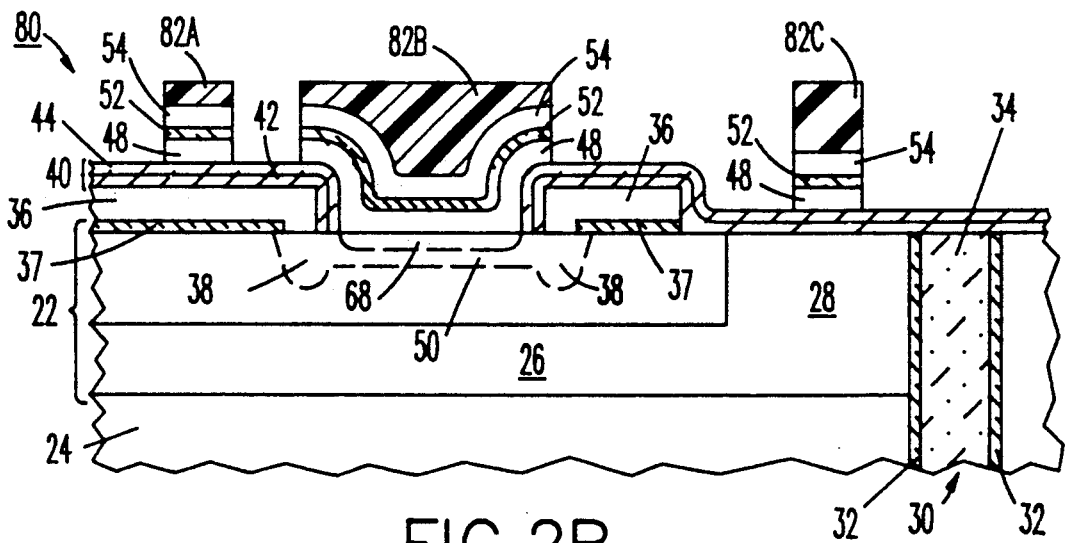
Figure 2C:
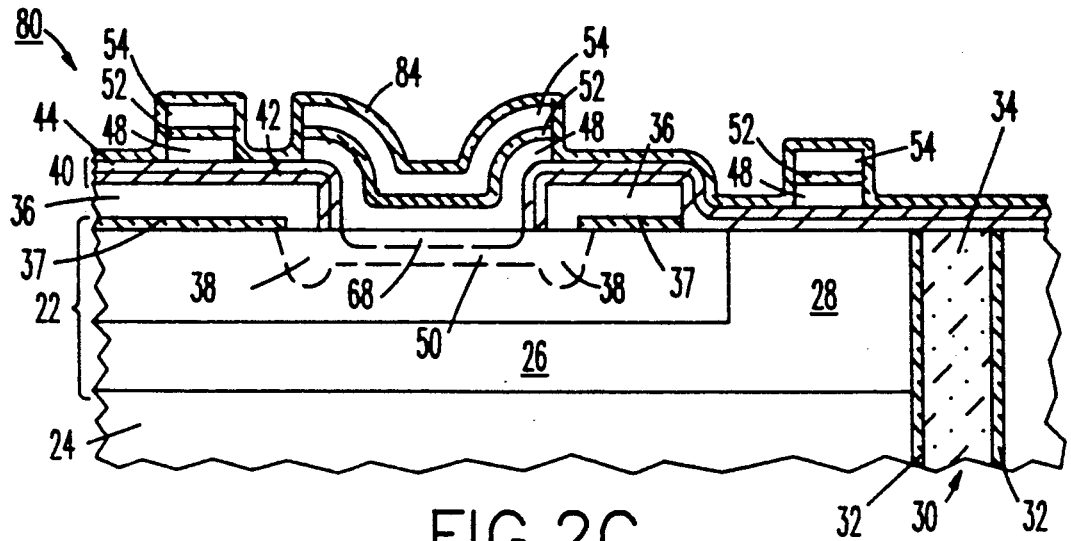

Referring now to FIG. 2B, appropriate etchants, described herein above, are used to anisotropically remove the unmasked portions of layers 54, 52, and 48, stopping on the upper surface of layer 44. As is shown in FIG. 2C, photoresist mask 82 is removed by conventional processes, and a layer 84 of Si$_3$N$_4$ is deposited conformally over the device. Layer 84 is formed using a conventional CVD process, and to a thickness in the range of about 300–500 Angstroms.

Figure 2D:
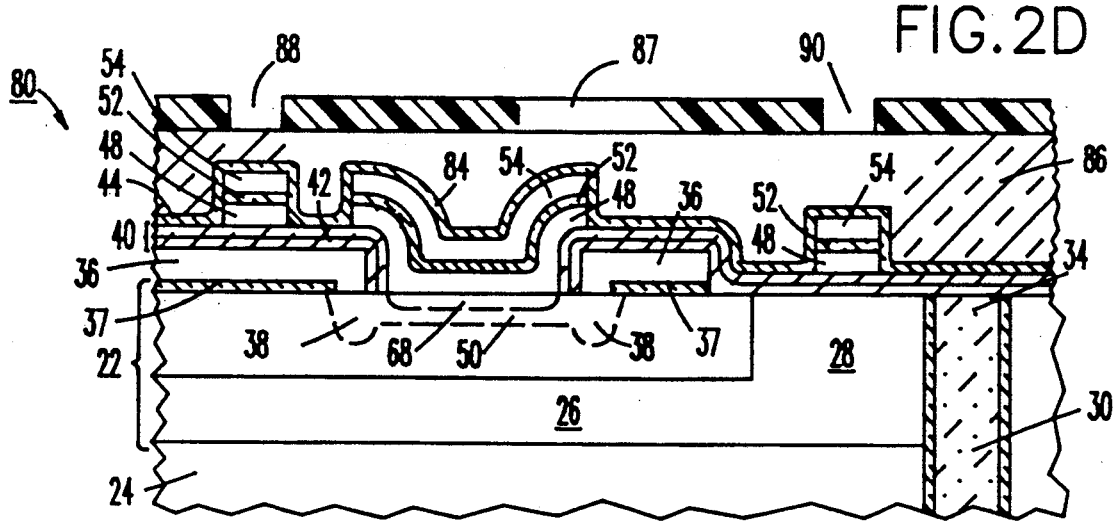

Referring now to FIG. 2D, a layer 86 of quartz is sputter-deposited conformally over the surface of device 80, to a depth in the range of about 2–3 micrometers. Quartz layer 86 is then planarized, for example using a conventional chemical-mechanical polishing process, and coated with a masking layer of photoresist 87. Photoresist mask 87 is formed and patterned, using conventional photolithographic techniques, to provide a pair of apertures 88, 90. Aperture 88 is positioned over the left-most remaining stack of layers 48, 52, 54, and will be used to define the position of a via to extrinsic base contact 36. Aperture 90 is positioned over the right-most remaining stack of layers 48, 52, 54, and will be used to define the position of a via to the top surface of subcollector reachthrough region 28.

Figure 2E:
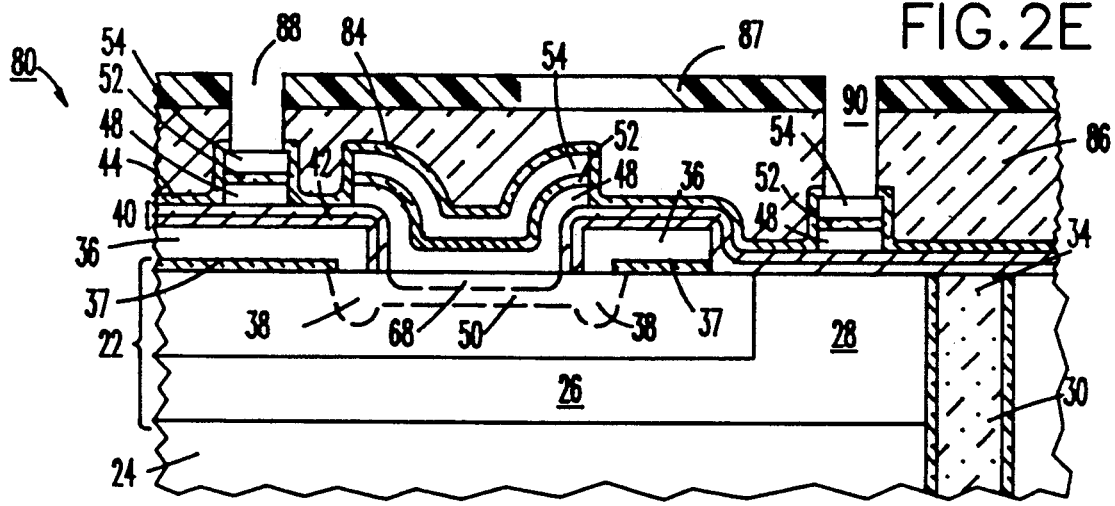

Referring now to FIG. 2E, an appropriate RIE process is used to extend apertures 88, 90 downward through layer 86 to expose the upper surface of etch-stop polysilicon layer 54. In accordance with a major feature and advantage of the present invention, in a manner analogous to that described with respect to FIG. 1D above, etch-stop layer 54 functions to prevent over-etching and damage at the bottom of aperture 88 while the formation of deeper aperture 90 is completed.

Figure 2F:
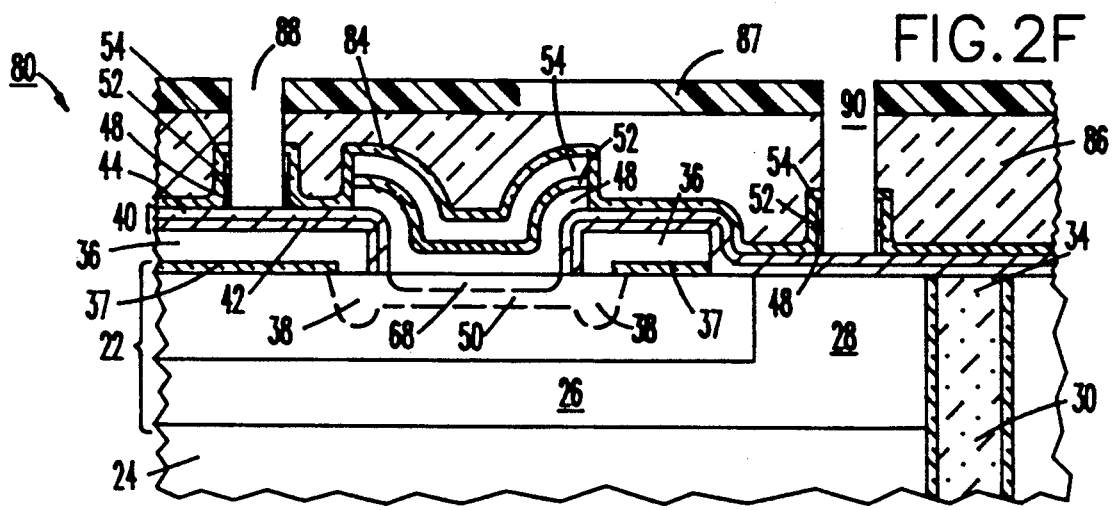

Referring now to FIG. 2F, apertures 88, 90 are extended, using appropriate etchants as described above, downward through layers 54, 52, 48, consecutively, to stop on the surface of layer 44.

Figure 2G:
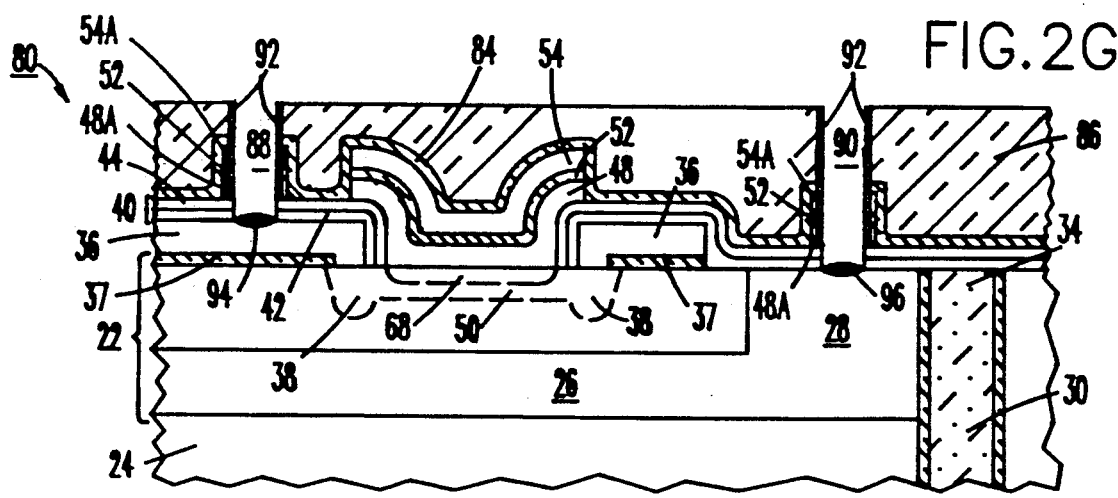

Referring now to FIG. 2G, photoresist mask 87 is removed using conventional methods, and the device is subjected to a conventional thermal oxidation process so as to oxidize the exposed edges of layers 48 and 4, these edges now being designated as 48A, 54A. Edges 48A, 54A are oxidized to at least about a 1,000 Angstrom thickness. An optional layer of $Si_3N_4$ is deposited conformally over the device using a conventional CVD process and an appropriate anisotropic used to remove the horizontal portions so as to leave optional vertical liners 92 over the walls within apertures 88, 90.

Appropriate etchants are used to remove insulator layers 44, 42, consecutively, so as to expose the surface of extrinsic base contact 36 at the bottom of aperture 88, and the surface of subcollector reachthrough region 28 at the bottom of aperture 90. A layer of platinum is deposited conformally over the device, and the device is sintered so as to form layers 94, 96 of PtSi at the bottoms of vias 88, 90, respectively. The remaining, unreacted regions of platinum are removed by etching with aqua regia.

Figure 2H:
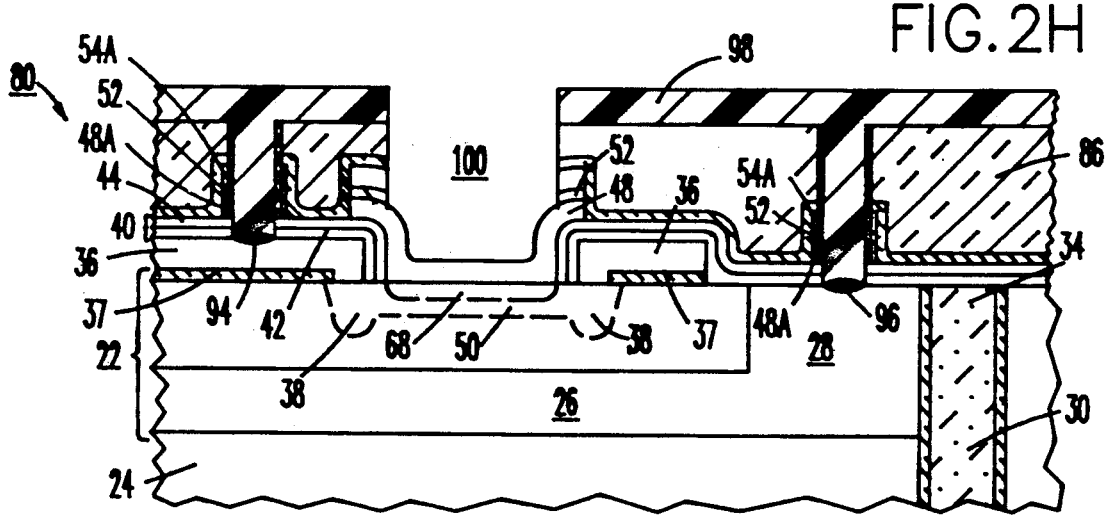

Referring now to FIG. 2H, a photoresist mask 98 is formed by conventional photolithographic techniques conformally over the device so as to fill vias 88, 90. Mask 98 is patterned to define an aperture 100 generally centered over emitter region 68 and the stack of layers 48, 52, 54 overlying the emitter region. Appropriate etchants are then used to anisotropically extend via 100 downward, first to etch-stop layer 54, and subsequently to the surface of doped polysilicon layer 48. Mask 98 is then removed by conventional methods.

It will be appreciated that, when the emitter aperture 100 is opened while vias 88, 90 remain filled with resist material 98, the formation of the via is completed without damaging the PtSi pads 94, 96. These pads might otherwise be damaged by the processes used to expose the surface of extrinsic emitter region 48.

Figure 2I:
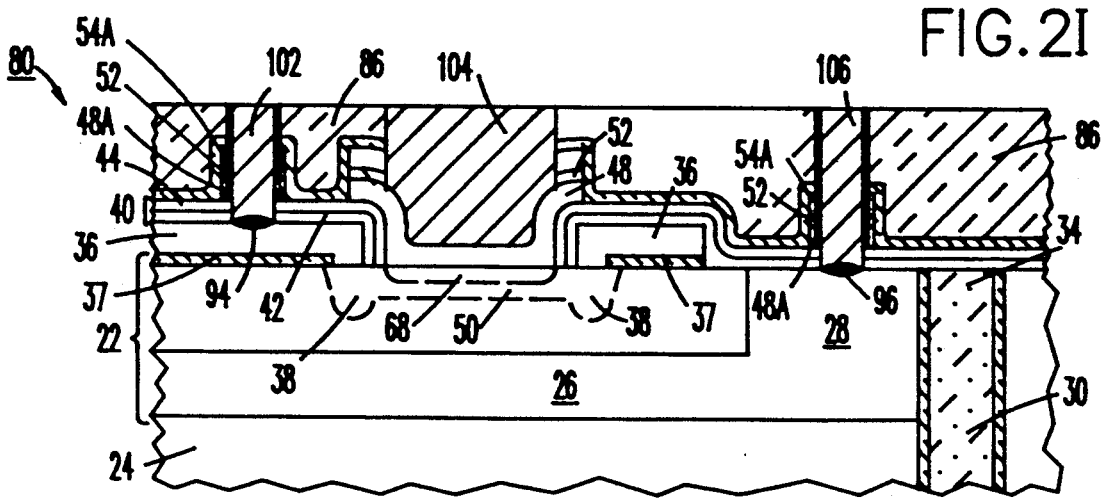

Referring now to FIG. 2I, a layer of metal, such as Tungsten or an aluminum-copper alloy, is deposited by a conventional sputtering, evaporation, or CVD process so as to fill vias 88, 90, 100 and to cover the surface of layer 86. The metal is then planarized, using for example a conventional chemical-mechanical polishing process, flush with the surface of quartz layer 86. The result is a metal stud contact 102 to PtSi pad 94 on the surface of extrinsic base contact 36, a metal stud contact 104 to the surface of N+ doped polysilicon layer 48 (i.e. the emitter contact), and a metal stud contact 106 to the PtSi pad 96 on the surface of subcollector reachthrough region 28. Subsequent layers of metallization (not shown) are used to connect and interconnect the metal studs 102, 104, and 106, and hence the bipolar transistor, in a desired manner.

There is thus provided a method of forming vias and, subsequently, device contacts to selected semiconductor device features. The method includes the use of an etch stop layer which accommodates contact vias of differing heights and widths while preventing overetching an device damage. The method is compatible with conventional processing techniques. There is further provided a detailed process for opening vias to the various regions of a bipolar transistor. The method of the present invention has particular application in the formation of small geometry semiconductor devices, and more particularly in the formation of very large scale integrated (VLSI) circuit devices.

While the present invention has been shown and described with respect to particular embodiments, it will be understood that it is not so limited. Numerous modifications, improvements, and variations within the scope of the invention will occur to those skilled in the art.

What is claimed is:

1. A method of forming electrical connections to a base contact, an emitter contact, and a subcollector reachthrough region of a bipolar transistor, comprising the steps of:
    forming a layer of etch stop material having a first etch characteristic over said base contact, emitter contact, and subcollector reachthrough region;
    forming a layer of dielectric material having a second etch characteristic conformally over said layer of etch stop material;
    simultaneously etching base contact and subcollector reachthrough vias through said layer of dielectric material using an etchant selective to said dielectric material so as to stop on said layer of etch stop material over said base contact and said subcollector reachthrough region;
    extending said base contact and subcollector reachthrough vias through said layer of etch sto material so as to expose the surfaces of said base contact and said subcollector reachthrough region;
    forming a mask over said base contact and subcollector reachthrough vias;
    etching an emitter contact via through said layer of dielectric material using an etchant selective to said dielectric material so as to stop on said layer of etch stop material over said emitter contact;
    extending said emitter contact via through said layer of etch stop material to the surface of said emitter contact; and
    removing said mask.

2. A method in accordance with claim 1 and further including the steps of:
    forming a layer of insulating material over said emitter contact before said step of forming said layer of etch stop material;
    forming a metal-silicon alloy pad on the surface of said base contact and subcollector reachthrough region exposed in the vias before said step of forming said mask; and
    removing the layer of insulating material over said emitter contact while said metal-silicon alloy pads are covered by said mask.

3. A method in accordance with claim 1 and further including the step of planarizing said layer of dielectric material before forming any of said vias.

4. A method in accordance with claim 3 wherein said step of etching said base contact and subcollector reachthrough vias includes the steps of:
    forming a mask over the surface of said layer of dielectric material including apertures defining the positions of said base contact and subcollector reachthrough vias; and
    reactive ion etching said layer of dielectric material.

5. A method in accordance with claim 4 wherein said step of etching said emitter contact via is performed with a reactive ion etching process.

6. A method in accordance with claim 1 wherein the etch ratio of said layer of dielectric material to said layer of etch stop material is selected to be at least 25:1.

7. A method in accordance with claim 1 wherein said dielectric material comprises quartz.

8. A method in accordance with claim 7 wherein said etch stop material comprises undoped polysilicon, aluminum oxide, magnesium oxide, or an organic insulator such as polyimide.

* * * * *